(12) United States Patent
Xu et al.

(10) Patent No.: US 10,217,332 B2
(45) Date of Patent: *Feb. 26, 2019

(54) HAPTIC ACTUATOR INCLUDING DAMPER BODY AND RELATED METHODS

(71) Applicant: Apple Inc., Cupertino, CA (US)

(72) Inventors: Yanchu Xu, San Jose, CA (US); Zhong-Qing Gong, Fremont, CA (US); Anping Guo, San Jose, CA (US); Alex M. Lee, Sunnyvale, CA (US); Junyi Yang, Fremont, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/645,444

(22) Filed: Jul. 10, 2017

(65) Prior Publication Data

US 2019/0012884 A1   Jan. 10, 2019

(51) Int. Cl.
| | |
|---|---|
| *H04B 3/36* | (2006.01) |
| *G08B 6/00* | (2006.01) |
| *G06F 3/01* | (2006.01) |
| *H05K 5/02* | (2006.01) |
| *B06B 1/04* | (2006.01) |

(52) U.S. Cl.
CPC ................ *G08B 6/00* (2013.01); *B06B 1/045* (2013.01); *G06F 3/016* (2013.01); *H05K 5/0217* (2013.01)

(58) Field of Classification Search
CPC .......... G08B 6/00; B06B 1/045; G06F 3/016; G06F 1/163; G06F 11/1048; H05K 5/0217; H02K 33/00; H02K 33/16; H01H 2231/028; H01H 2215/00; A63F 13/285; A63F 13/54; B41J 2/05; F21V 33/0056; G11B 5/4873; H04R 25/606

USPC ............. 340/407.1; 345/173, 156, 161, 163; 381/413

See application file for complete search history.

(56) References Cited

U.S. PATENT DOCUMENTS

| | | | | |
|---|---|---|---|---|
| 8,169,402 B2 * | 5/2012 | Shahoian | ................ | G06F 3/016 345/156 |
| 10,038,361 B2 * | 7/2018 | Hajati | ...................... | G06F 1/163 |
| 2009/0038726 A1 * | 2/2009 | Yukawa | ................ | B60C 19/002 152/454 |
| 2010/0296691 A1 * | 11/2010 | Komatsu | .................. | H04R 7/26 381/413 |

(Continued)

FOREIGN PATENT DOCUMENTS

| | | |
|---|---|---|
| WO | 2013169299 A1 | 11/2013 |
| WO | 2013169303 A1 | 11/2013 |

(Continued)

OTHER PUBLICATIONS

Product Specification Sheet: GEEPLUS, VIBRO1 Vibration Actuator, 2 pages, www.geeplus.biz, downloaded on Jul. 15, 2015.

*Primary Examiner* — Anh V La (74) *Attorney, Agent, or Firm* — Allen, Dyer, Doppelt + Gilchrist, P.A.

(57) ABSTRACT

A haptic actuator may include a housing, at least one coil carried by the housing, and a field member having opposing first and second sides. The haptic actuator may also include a respective flexure bearing mounting each of the first and second sides of the field member to be reciprocally movable within the housing responsive to the at least one coil. At least one of the flexure bearings may include an arm and a damper body attached thereto.

22 Claims, 14 Drawing Sheets

(56) References Cited

U.S. PATENT DOCUMENTS

| | | | |
|---|---|---|---|
| 2012/0025742 A1* | 2/2012 | Masahiko | B06B 1/0207 318/114 |
| 2013/0100046 A1* | 4/2013 | Chuang | G06F 3/016 345/173 |
| 2014/0197936 A1 | 7/2014 | Biggs et al. | |
| 2015/0109223 A1 | 4/2015 | Kessler et al. | |
| 2015/0116205 A1 | 4/2015 | Westerman et al. | |
| 2015/0130730 A1 | 5/2015 | Harley et al. | |
| 2015/0194870 A1* | 7/2015 | Kim | H02K 33/18 310/25 |

FOREIGN PATENT DOCUMENTS

| | | |
|---|---|---|
| WO | 2013169305 A1 | 11/2013 |
| WO | 2013170099 A1 | 11/2013 |
| WO | 2013188307 A2 | 12/2013 |
| WO | 2014018111 A1 | 1/2014 |
| WO | 2015020663 A1 | 2/2015 |

\* cited by examiner

FIG. 14

US 10,217,332 B2

HAPTIC ACTUATOR INCLUDING DAMPER BODY AND RELATED METHODS

TECHNICAL FIELD

The present disclosure relates to the field of electronics, and, more particularly, to the field of haptics.

BACKGROUND

Haptic technology is becoming a more popular way of conveying information to a user. Haptic technology, which may simply be referred to as haptics, is a tactile feedback based technology that stimulates a user's sense of touch by imparting relative amounts of force to the user.

A haptic device or haptic actuator is an example of a device that provides the tactile feedback to the user. In particular, the haptic device or actuator may apply relative amounts of force to a user through actuation of a mass that is part of the haptic device. Through various forms of tactile feedback, for example, generated relatively long and short bursts of force or vibrations, information may be conveyed to the user.

SUMMARY

A haptic actuator may include a housing, at least one coil carried by the housing, and a field member having opposing first and second sides. The haptic actuator may also include a respective flexure bearing mounting each of the first and second sides of the field member to be reciprocally movable within the housing responsive to the at least one coil. At least one of the flexure bearings may include an arm and a damper body attached thereto.

The haptic actuator may also include an adhesive layer between the arm and the damper body. The adhesive layer may include a pressure sensitive adhesive layer, for example.

The arm may have a strip shape with opposing major surfaces, and the damper body may have a rectangular shape carried by one of the opposing major surfaces of the arm.

The at least one flexure bearing may also include a further arm joined together with the arm at proximal ends thereof and each having spaced apart distal ends operatively coupled between adjacent portions of the field member and the housing. The damper body may be carried by the spaced apart distal end of the arm, for example.

The arm and further arm may define a wishbone shape. The at least one flexure bearing may have a bend therein joining together the arm and the further arm at the proximal ends. The damper body may include stainless steel, for example.

A method aspect is directed to a method of making a haptic actuator. The method may include mounting a field member having opposing first and second sides within a housing using a respective flexure bearing so that each of first and second sides of the field member is reciprocally movable within the housing responsive to at least one coil. The method may also include attaching a damper body to at least one arm of at least one flexure bearing.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation is used to refer to like elements in different embodiments.

Figure 1:
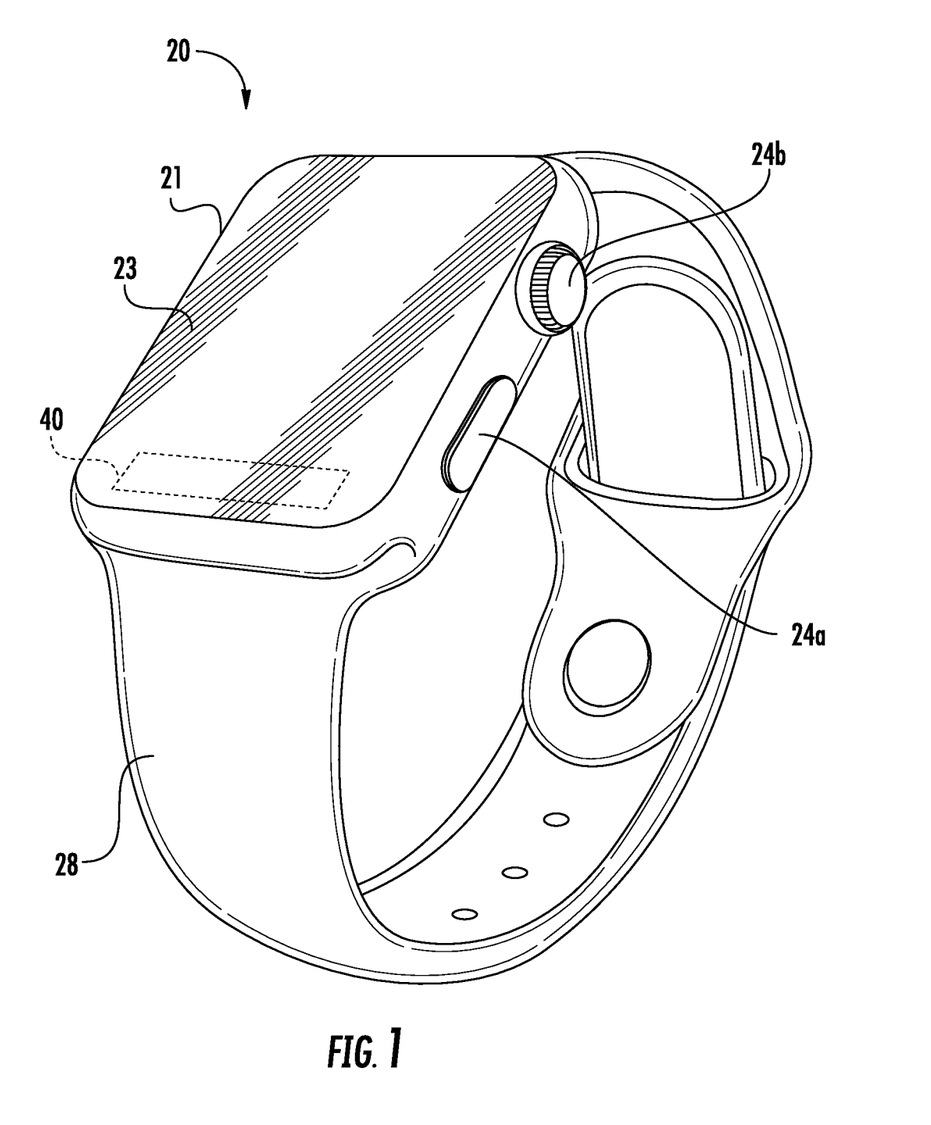
FIG. 1 is a perspective view of an electronic device including a haptic actuator according to an embodiment of the present invention.
Figure 2:
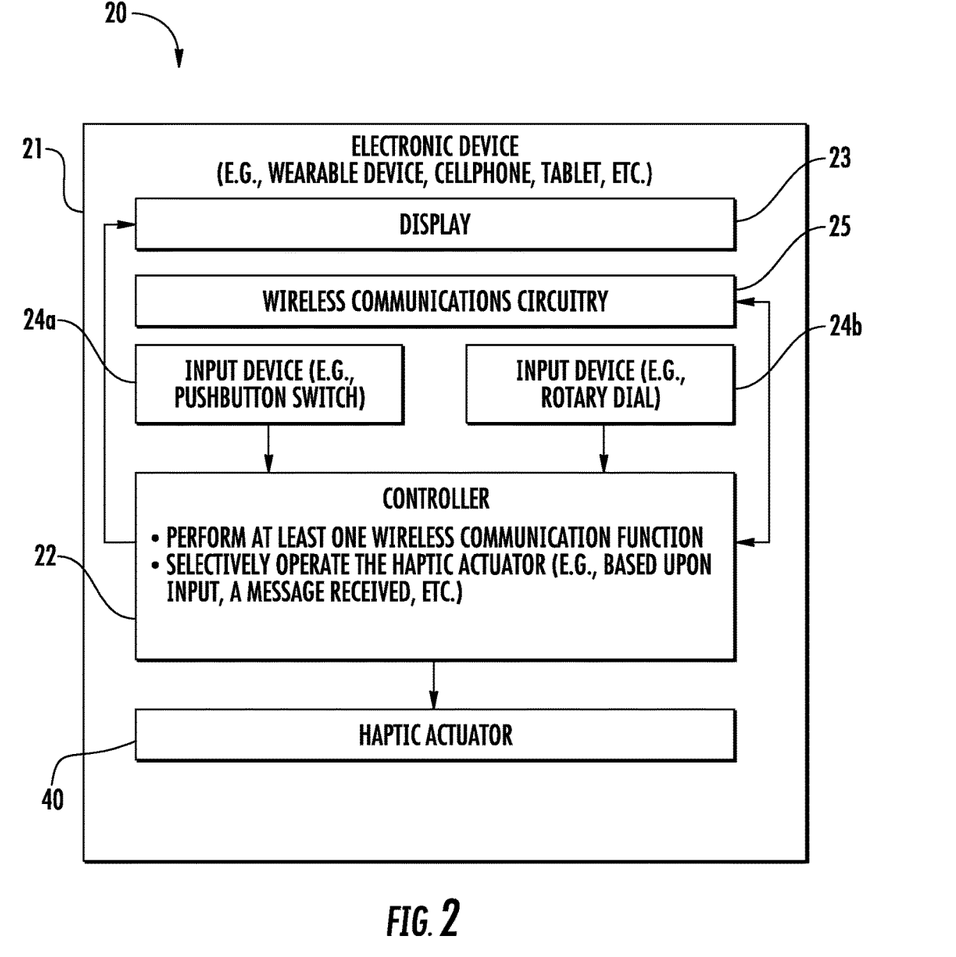
FIG. 2 is a schematic block diagram of the electronic device of FIG. 1.

Referring initially to FIGS. 1 and 2, an electronic device 20 illustratively includes a device housing 21 and a controller 22 carried by the device housing. The electronic device 20 is illustratively a mobile wireless communications device, for example, a wearable wireless communications device, and includes a band 28 or strap for securing it to a user. The electronic device 20 may be another type of electronic device, for example, a cellular telephone, a tablet computer, a laptop computer, etc.

Wireless communications circuitry 25 (e.g. cellular, WLAN Bluetooth, etc.) is also carried within the device housing 21 and coupled to the controller 22. The wireless communications circuitry 25 cooperates with the controller 22 to perform at least one wireless communications function, for example, for voice and/or data. In some embodiments, the electronic device 20 may not include wireless communications circuitry 25.

A display 23 is also carried by the device housing 21 and is coupled to the controller 22. The display 23 may be a liquid crystal display (LCD), for example, or may be another type of display, as will be appreciated by those skilled in the art.

Finger-operated user input devices 24a, 24b, illustratively in the form of a pushbutton switch and a rotary dial are also carried by the device housing 21 and are coupled to the controller 22. The pushbutton switch 24a and the rotary dial 24b cooperate with the controller 22 to perform a device function in response to operation thereof. For example, a device function may include a powering on or off of the electronic device 20, initiating communication via the wireless communications circuitry 25, and/or performing a menu function.

The electronic device 20 illustratively includes a haptic actuator 40. The haptic actuator 40 is coupled to the controller 22 and provides haptic feedback to the user in the form of relatively long and short vibrations or "taps", particularly when the user is wearing the electronic device 20. The vibrations may be indicative of a message received, and the duration of the vibration may be indicative of the type of message received. Of course, the vibrations may be indicative of or convey other types of information. More particularly, the controller 22 applies a voltage to move a moveable body or masses between first and second positions in a y-axis.

While a controller 22 is described, it should be understood that the controller 22 may include one or more of a processor and other circuitry to perform the functions described herein. For example, the controller 22 may include a class-D amplifier to drive the haptic actuator 40 and/or sensors for sensing voltage and current.

Figure 3:
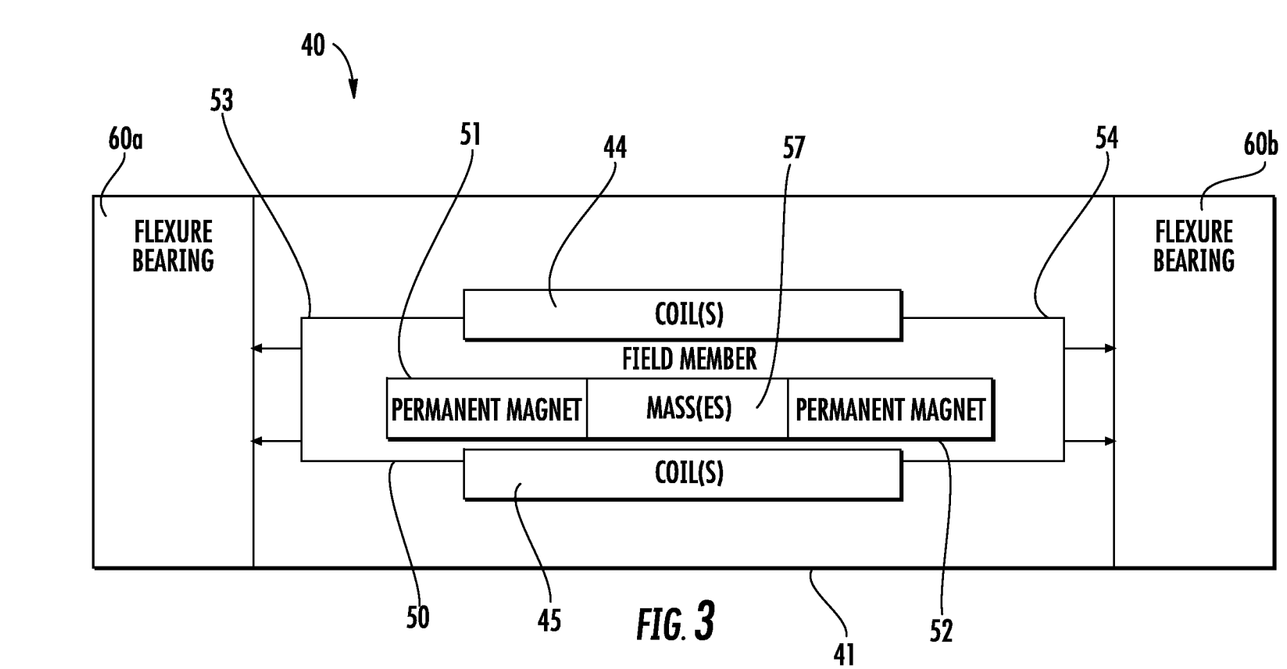
FIG. 3 is a schematic block diagram of a portion of the haptic actuator of FIG. 2.
Figure 4:
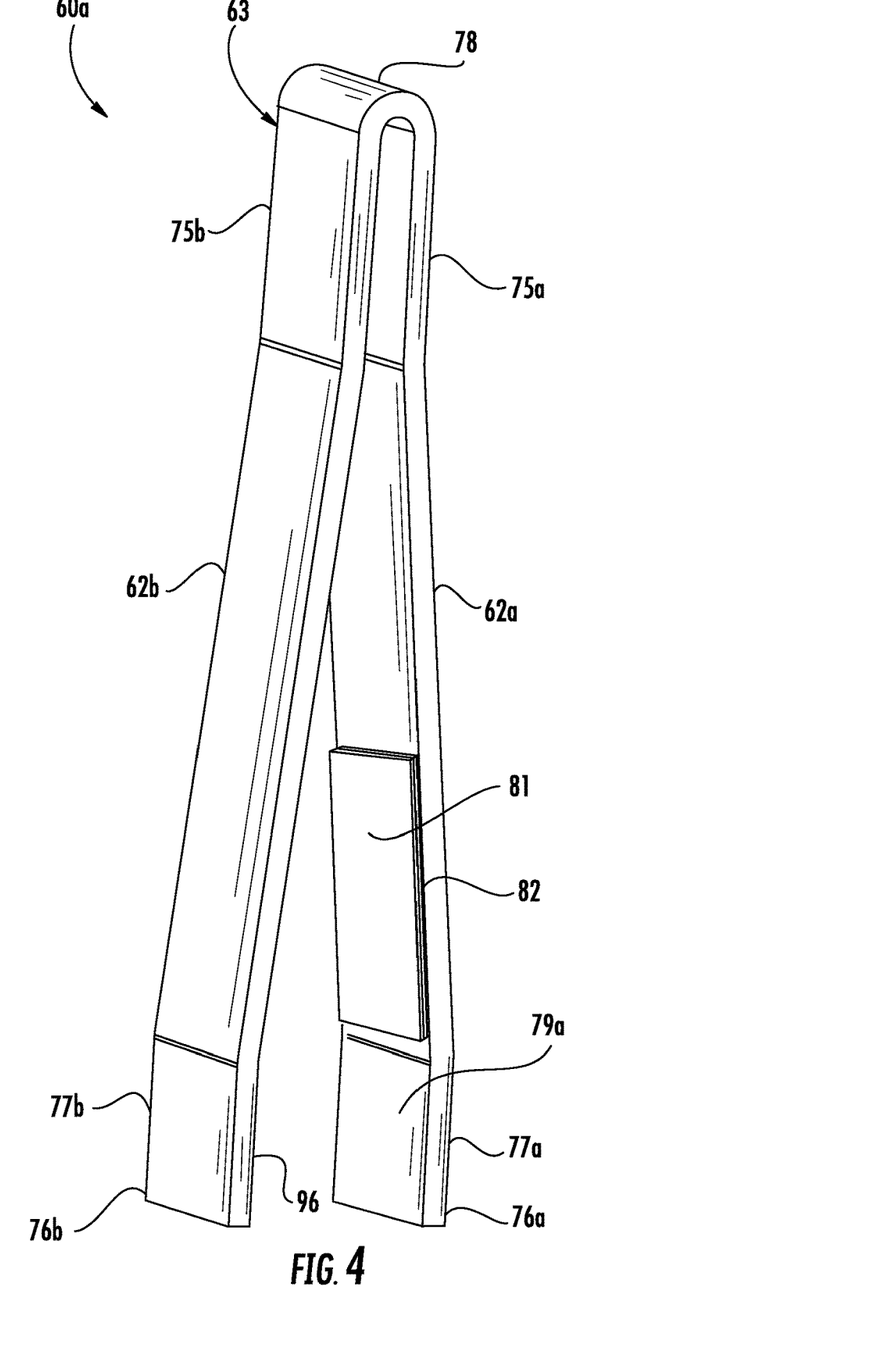
FIG. 4 is an enlarged schematic diagram of a flexible member according to an embodiment.
Figure 5:
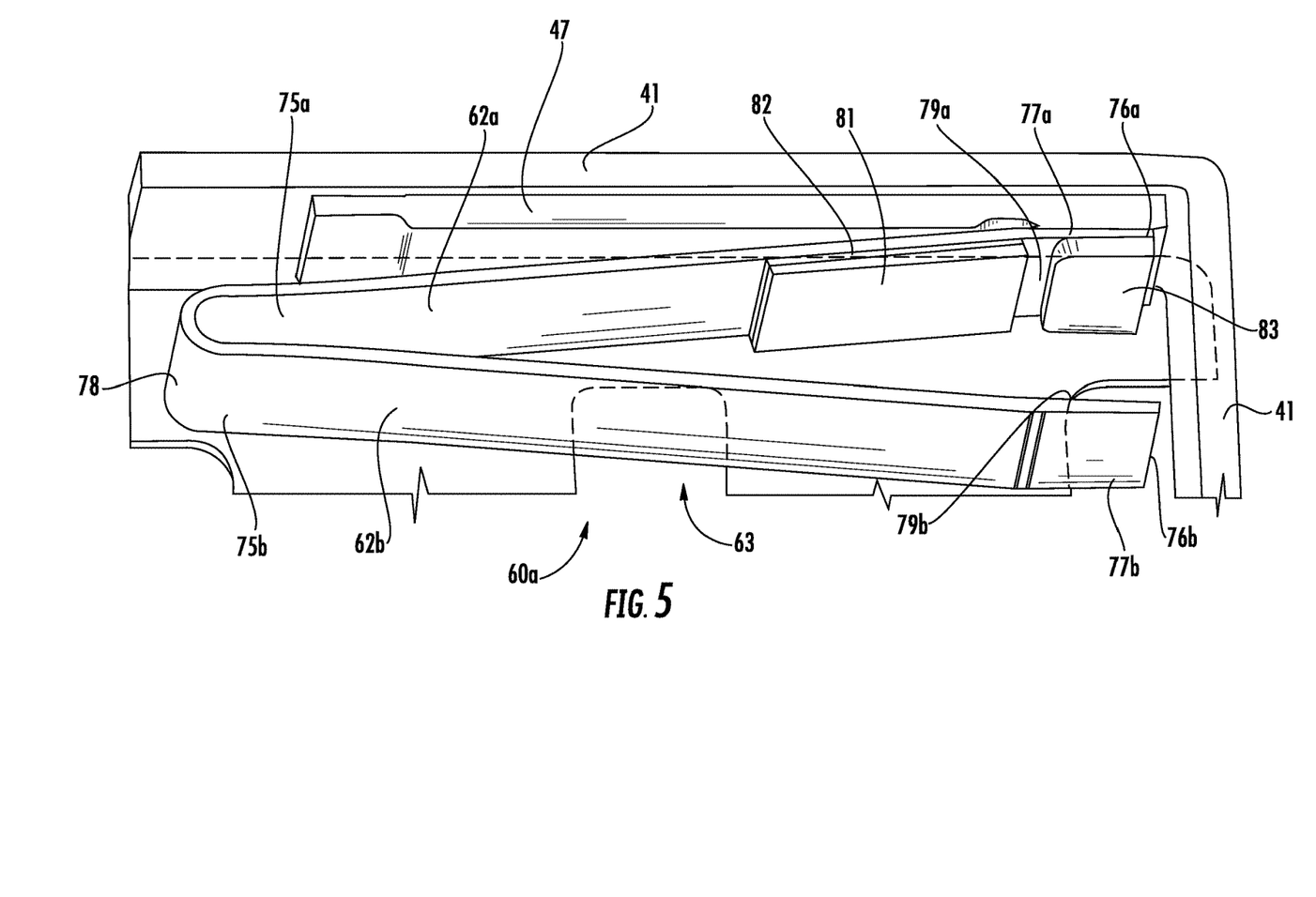
FIG. 5 is a schematic diagram of a portion of a haptic actuator according to an embodiment.

Referring now additionally to FIGS. 3-5, the haptic actuator 40 includes an actuator housing 41. The actuator housing 41 illustratively has a dimension in a length direction greater than a width direction. The actuator housing 41 may be ferritic. More particularly, the top and bottom of the actuator housing 41 may be ferritic. Of course other and/or additional portions of the actuator housing 41 may be ferritic.

The haptic actuator 40 also includes first and second coils 44, 45 carried by the actuator housing 41, for example, the top and the bottom, respectively. The first and second coils 44, 45 may have a loop shape or "racetrack" shape and may be aligned in a stacked relation and spaced apart. While first and second coils 44, 45 are illustrated, it should be noted that any number of coils may be used, for example, a set of first coils and a set of second coils carried by the top and bottom of the actuator housing 41, respectively.

The haptic actuator 40 also includes a field member 50 carried by the actuator housing 41. The field member 50, similarly to the actuator housing 41, has a dimension in a length direction greater than a width direction. Thus, the field member 50 is reciprocally movable in the width direction (i.e., the y-direction). While the movement of the field member 50 is described as being moveable in one direction, i.e., a linear haptic actuator, it should be understood that in some embodiments, the field member may be movable in other directions, i.e., an angular haptic actuator, or may be a combination of both a linear and an angular haptic actuator.

The field member 50 illustratively includes permanent magnets 51, 52 between the first and second coils 44, 45. The permanent magnets 51, 52 may be neodymium, for example, and may be positioned in opposing directions with respect to their respective poles.

The permanent magnets 51, 52 may also have a rectangular shape and may be aligned along a length of the first and second coils 44, 45. It will be appreciated that there may be any number of permanent magnets having any shape between the first and second coils 44, 45.

The field member 50 also includes a mass 57 between the permanent magnets 51, 52. The mass 57 may be tungsten, for example. The mass 57 may be a different material and there may be more than one mass. For example, masses may be between the permanent magnets 51, 52 and may be part of the body of the field member 50, extending across the field member and defining openings therein.

The haptic actuator 40 also includes respective flexure bearings 60a, 60b mounting each of first and second sides 53, 54 of the field member 50 to be reciprocally movable within the actuator housing 41 responsive to the first and second coils 44, 45. While the term flexure bearing is used, it should be understood by those skilled in the art that it may include a flexure spring and flexure suspension, for example. A respective anchor body 47 may be mounted between the corresponding flexure bearing 60a, 60b and adjacent portions of the actuator housing 41.

Each of the flexure bearings 60a, 60b includes a flexible member 63 having a wishbone or Y-shape, with two diverging arms 62a, 62b joined together at proximal ends 75a, 75b. The two diverging arms 62a, 62b have spaced distal ends 76a, 76b operatively coupled between adjacent portions of the field member 50 and the actuator housing 41. Each diverging arm 62a, 62b has a strip shape with opposing major surfaces 79a, 79b. Each flexure bearing 60a, 60b may have more than one flexible member 63.

The flexible member 63 has a bend 78 therein joining together the two diverging arms 62a, 62b at the proximal ends 75a, 75b. The bend 78 causes the two diverging arms 62a, 62b to be spaced apart at the distal ends 76a, 76b. Illustratively, the two diverging arms 62a, 62b include a parallel portion 77a, 77b at the distal ends 76a, 76b. In some embodiments, the distal ends 76a, 76b of the two diverging arms 62a, 62b may continue to diverge instead of turning or becoming parallel. In some embodiments, the two diverging arms 62a, 62b may be parallel at the proximal ends 75a, 75b and coupled together, for example, via a weld joint.

Each flexure bearing 60a, 60b also illustratively includes a damper body 81, for example, a stainless steel damper body, attached to one of the two diverging arms 62a, 62b. The damper body 81 may also or alternatively include aluminum. The damper body 81 may be or include other and/or additional materials.

The damper body 81 may have a rectangular shape carried by one of the opposing major surfaces 79a, 79b of the respective diverging arm 62a, 62b. Exemplary dimensions of the damper body 81 are 2.2 mm×1.8 mm×0.15 mm. The damper body 81 is illustratively carried by the spaced apart distal end of the respective diverging arm 62a, 62b facing the other diverging arm. More particularly, the damper body 81 is carried by the suspended arm 62a.

The damper body 81 is illustratively used in conjunction with a bumper body 83. Illustratively, the bumper body 83 may be carried by the spaced apart distal end 76a, 76b of a diverging arm 62a, 62b, and the damper body 81 may be carried by the same diverging arm spaced from the bumper body closer to the proximal end 75a, 75b. In some embodiments, the damper body 81 and the bumper body 83 may combined into a single body of material. More than one damper body 81 may be carried by a given diverging arm 62a, 62b, and/or a damper body 81 may be carried by the other diverging arm. Additionally, placement of the damper body 81 may be based upon a desired Q-factor in different modes of operation of the haptic actuator 40, for example.

An adhesive layer 82 is between the damper body 81 and the respective diverging arm 62a, 62b. The adhesive layer 82 may be a pressure sensitive adhesive, such as, for example, RA960 Damping Adhesive available from Roush Enterprises of Livonia, Mich.

Exemplary installation or production techniques of the damper body 81 and adhesive layer 82 will now be described. One example technique is based upon the pick-and-place technique. It may be desirable to place the damper body 81 and the adhesive layer 82 before flexure bending. The flexure bearing 60a, 60b may undergo heat treatment after flexure bending. The damper body 81 and adhesive layer 82 may also be positioned before laser spot welding, however, this may cause the flexure to be exposed to temperatures greater than 300° F. Alternatively, the damper body 81 and adhesive layer 82 may also be positioned after laser spot welding, however, this particular attention to the bond quality may be desirable.

As will be appreciated by those skilled in the art, during operation of the haptic actuator 40, the flexure bearings 60a, 60b may continue to move or flex even after the field member 50 has stopped moving, which may generate unwanted noise. For example, yaw-mode coupled z-axis motion may be a cause for ring down noise. Thus, the damper body 81 may provide increased damping of noise generated by the continued movement of the flexure bearings 60a, 60b. For example, the damper body 81 may provide a 1% damping to provide improved acoustics or noise reduction. The damper body 81 may also provide greater than 2% damping effectiveness for yaw-mode and Y-mode operations, and the adhesive layer 82 may be particularly helpful for moving the yaw-mode "higher" so as to separate it from the z-mode.

An exemplary damper body 81 and adhesive layer 82 of 150 microns of stainless steel and 50 microns of pressure sensitive adhesive, respectively, for example, may provide upwards of or greater than 1% damping for yaw modes of operation. A 1% modal damping, for example, may make free vibration decay fast enough to eliminate the ring down effect, which may be undesirable with respect to noise. The above exemplary damper body 81 and adhesive layer 82 may also provide greater than 1% damping for Y modes of operation. With respect to temperature, the above exemplary damper body 81 and adhesive layer 82, through simulation, show that there may be no damping distribution difference between room temperature and high temperature. However a smaller adhesive layer 82, for example, 25 microns, may improve operation at higher temperatures.

The table below shows simulations of how much damping is required.

| Ring Down Simulation | 0.2% | 0.5% | 0.8% | 1% | 2% | 5% |
| --- | --- | --- | --- | --- | --- | --- |
| # of Cycles for Decaying to 10% (20 dB) | 183 | 73 | 45 | 36 | 18 | 7 |
| 20 dB Ring Down (ms) | 332 | 132 | 81 | 65 | 32 | 12 |

Figure 6:
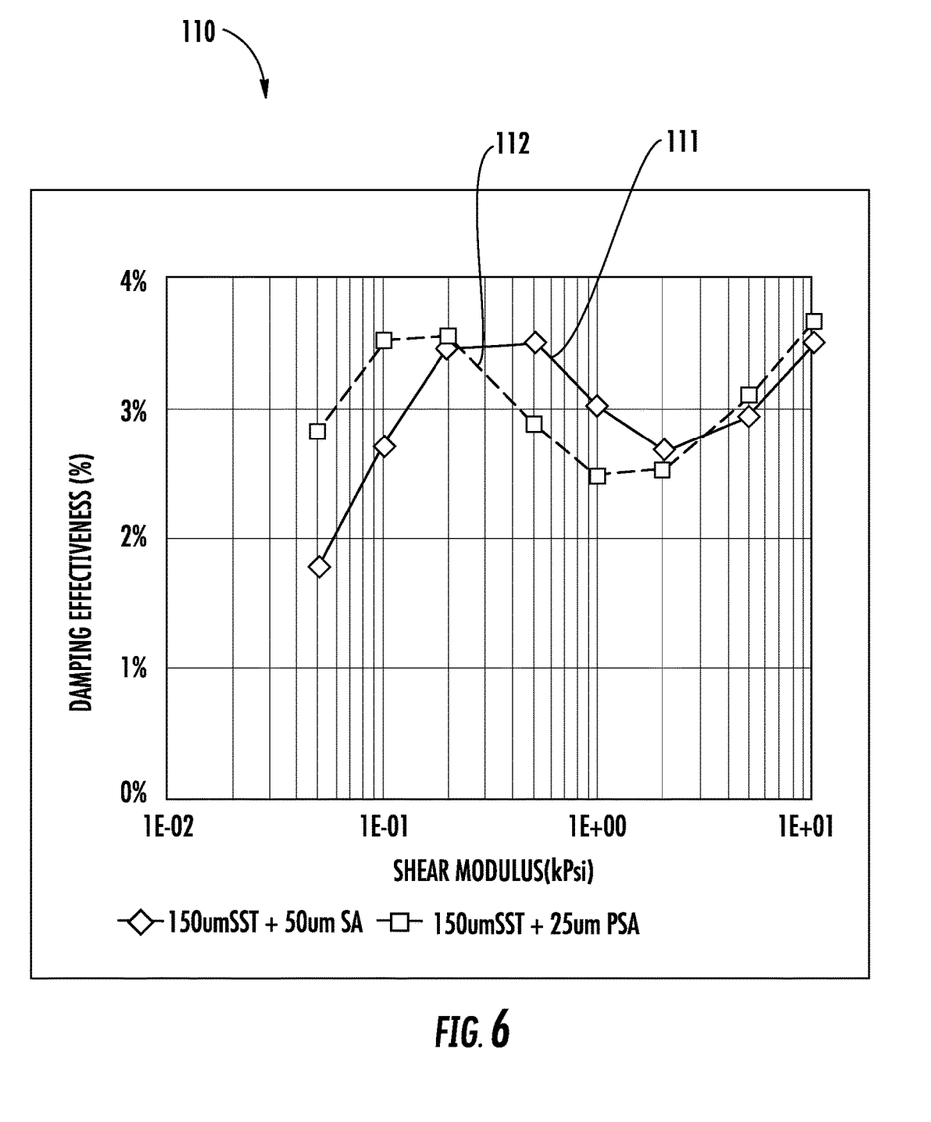
FIG. 6 is a graph of simulated yaw mode damping effectiveness versus the modulus of the adhesive layer according to an embodiment.

Referring now to the graph 110 in FIG. 6, the yaw mode damping effectiveness versus the modulus of the adhesive layer 82 (i.e., pressure sensitive) is illustrated. Line 111 corresponds to a stainless steel damper body 81 of 150 microns with a 50 micron pressure sensitive adhesive layer 82, while line 112 corresponds to a stainless steel damper body of 150 microns and a pressure sensitive adhesive layer of 25 microns.

Figure 7:
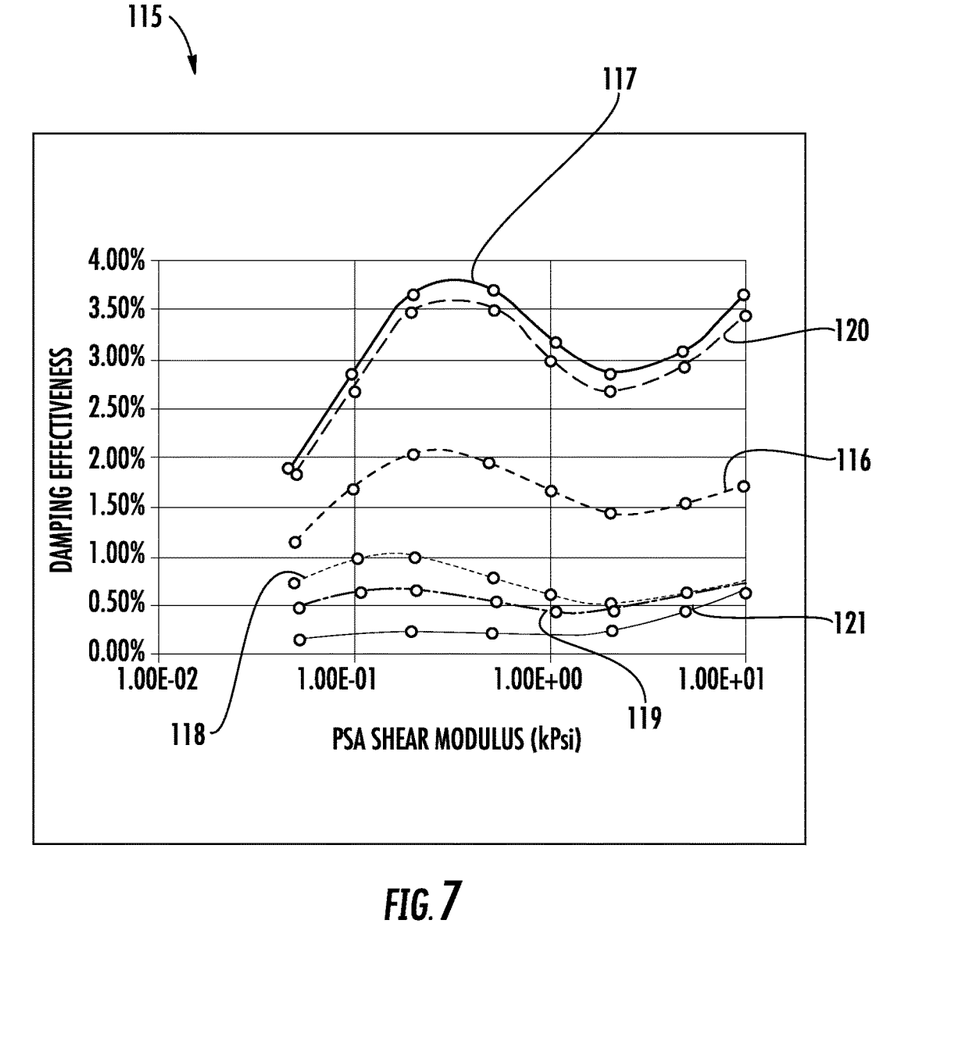
FIG. 7 is a graph of simulated effectiveness of a stainless steel damper body according to an embodiment.

The graph 115 in FIG. 7 illustrates effectiveness of a stainless steel damper body 81 of 150 microns with a 50 micron pressure sensitive adhesive layer 82 across modes of operation. Line 116 corresponds to the working mode (with a maximum frequency change of 5 Hz), line 117 corresponds to the Y-mode (31 Hz), line 118 to the first rocking mode (with a maximum frequency change of 8.5 Hz), line 119 corresponds to the Z-mode (8.3 Hz), line 120 corresponds to the yaw-mode (with a maximum frequency change of 43 Hz), and line 121 corresponds to the second rocking mode (with a maximum frequency change of 11 Hz).

Figure 8:
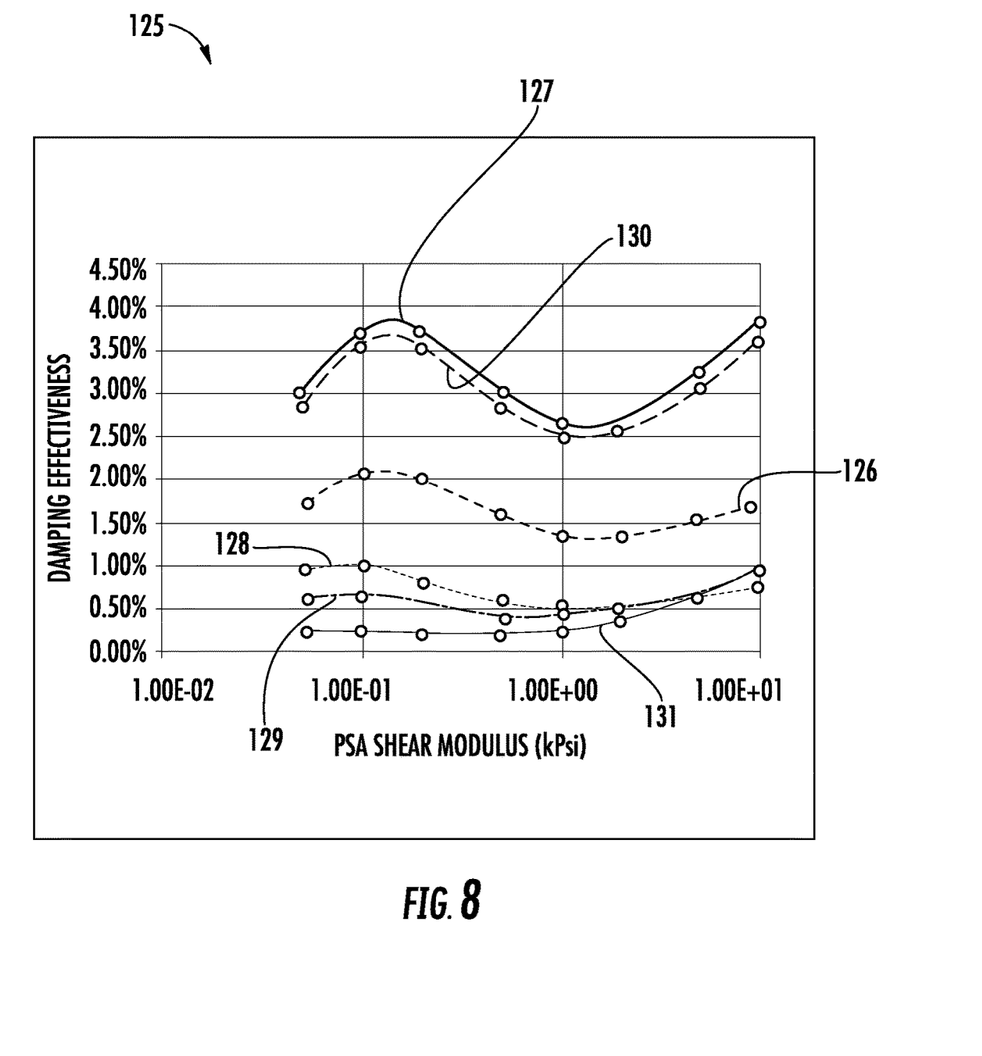
FIG. 8 is a graph of simulated effectiveness of a stainless steel damper body according to an embodiment.

The graph 125 in FIG. 8 illustrates the effectiveness of a stainless steel damper body 81 of 150 microns with a 25 micron pressure sensitive adhesive layer 82 across modes of operation. Line 126 corresponds to the working mode (with a maximum frequency change of 5 Hz), line 127 corresponds to the Y-mode (with a maximum frequency change of 31 Hz), line 128 to the first rocking mode (with a maximum frequency change of 8.5 Hz), line 129 corresponds to the Z-mode (with a maximum frequency change of 8.3 Hz), line 130 corresponds to the yaw-mode (with a maximum frequency change of 43 Hz), and line 131 corresponds to the second rocking mode (with a maximum frequency change of 11 Hz).

Figure 9:
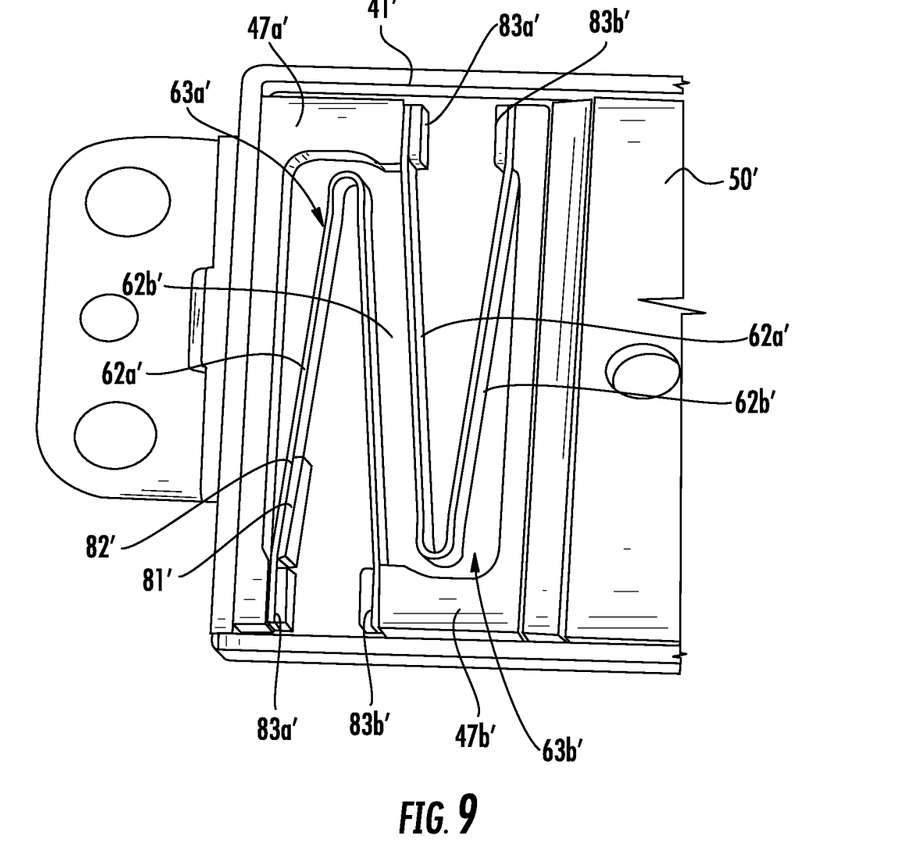
FIG. 9 is a schematic diagram of a portion of a haptic actuator according to another embodiment.

Referring now to FIG. 9, in some embodiments, more than one flexible member may be used between a given side of the field member 50' and the corresponding adjacent side of the actuator housing 41' defining outer and inner flexible members 63a', 63b'. Corresponding outer and inner anchor members 47a', 47b' are illustratively coupled between the outer flexible member 63a' and the adjacent portions of the actuator housing 41', and the inner flexible member 63b' and the adjacent portions of the field member 50'. Illustratively, a damper body 81' is carried by the outer flexible member 63a' only, and corresponding bumper bodies 83a', 83b' are carried by respective spaced apart distal ends 76a', 76b' of each diverging arm 62a', 62b'.

Figure 10:
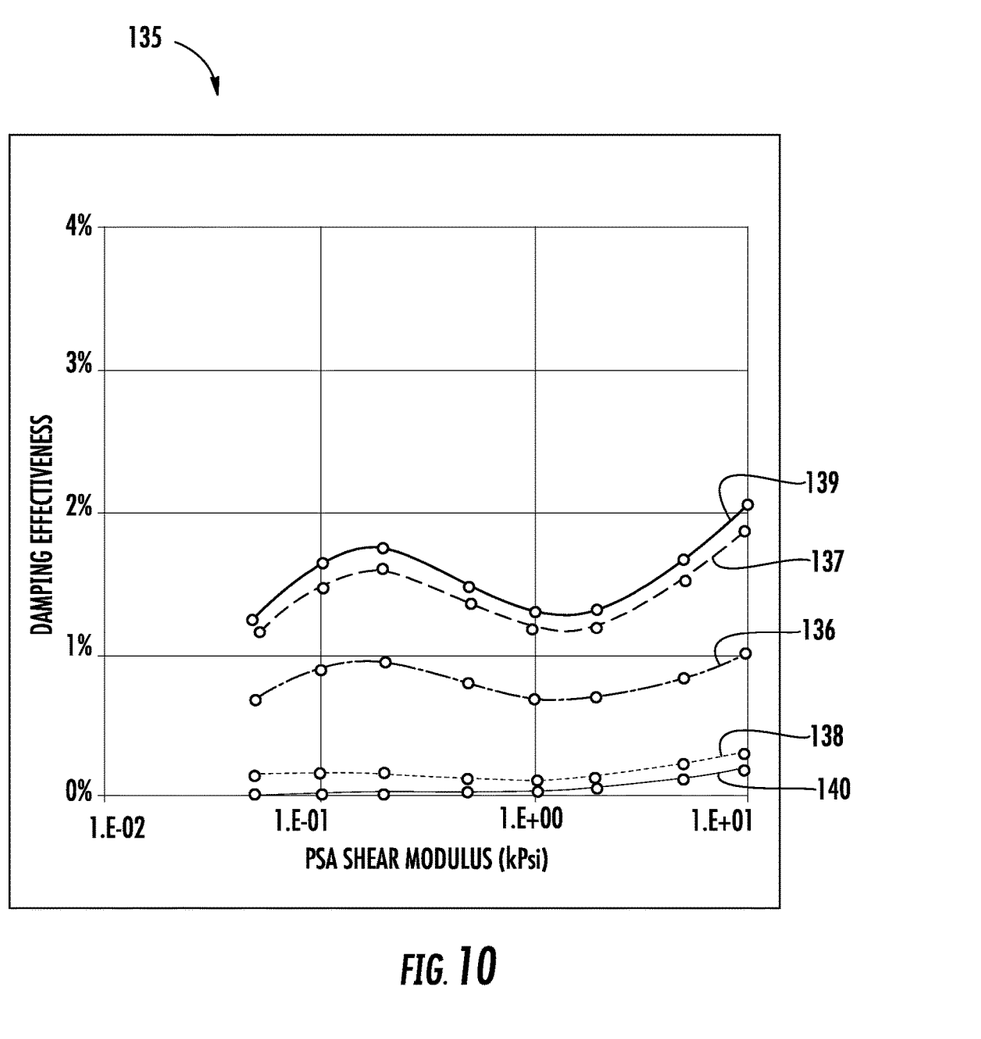
FIG. 10 is a graph of simulated damping effectiveness versus modulus of the pressure sensitive adhesive layer according to an embodiment.

Referring now to the graph 135 in FIG. 10, the damping effectiveness versus modulus of the pressure sensitive adhesive layer 82' is shown for a stainless steel damper body 81' of 150 microns carried by the outer flexible member 63a' only (FIG. 9) with a 25 micron pressure sensitive adhesive layer 82' across modes of operation. Line 136 corresponds to the working mode, line 137 corresponds to the Y-mode, line 138 corresponds to the Z-mode, line 139 corresponds to the yaw-mode, and line 140 corresponds to the rocking mode.

Figure 11:
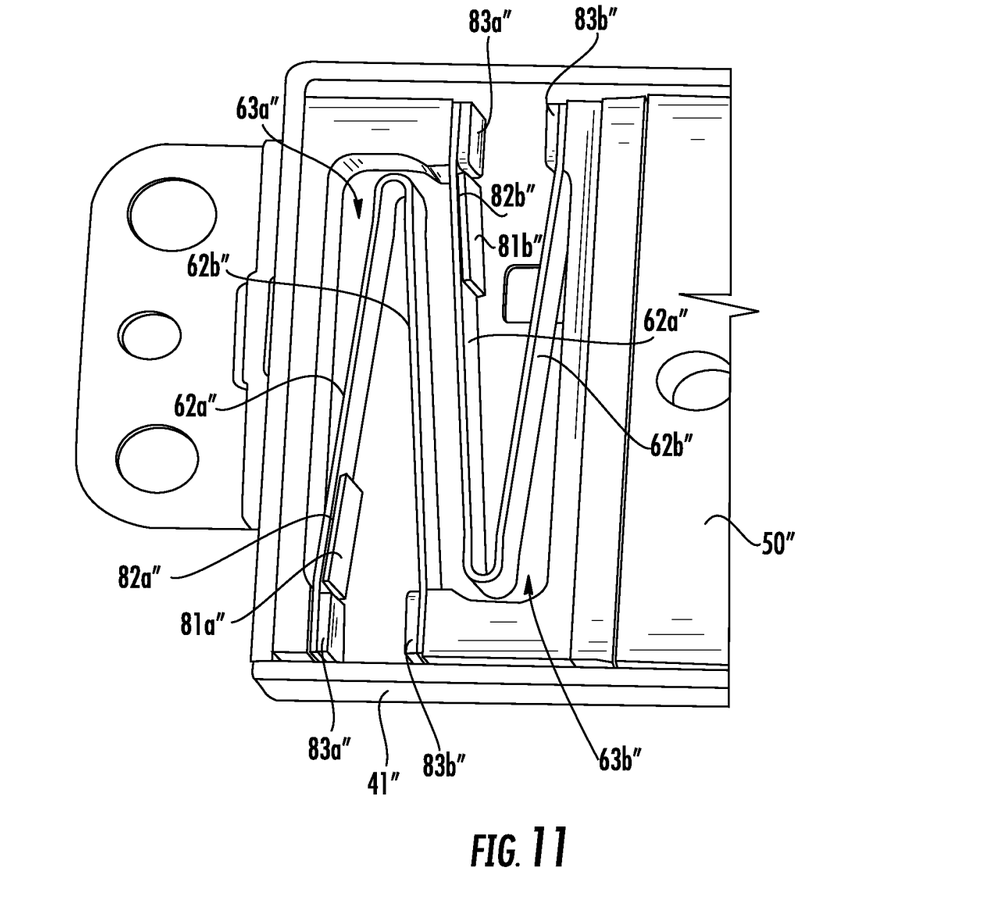
FIG. 11 is a schematic diagram of a portion of a haptic actuator according to another embodiment.
Figure 12:
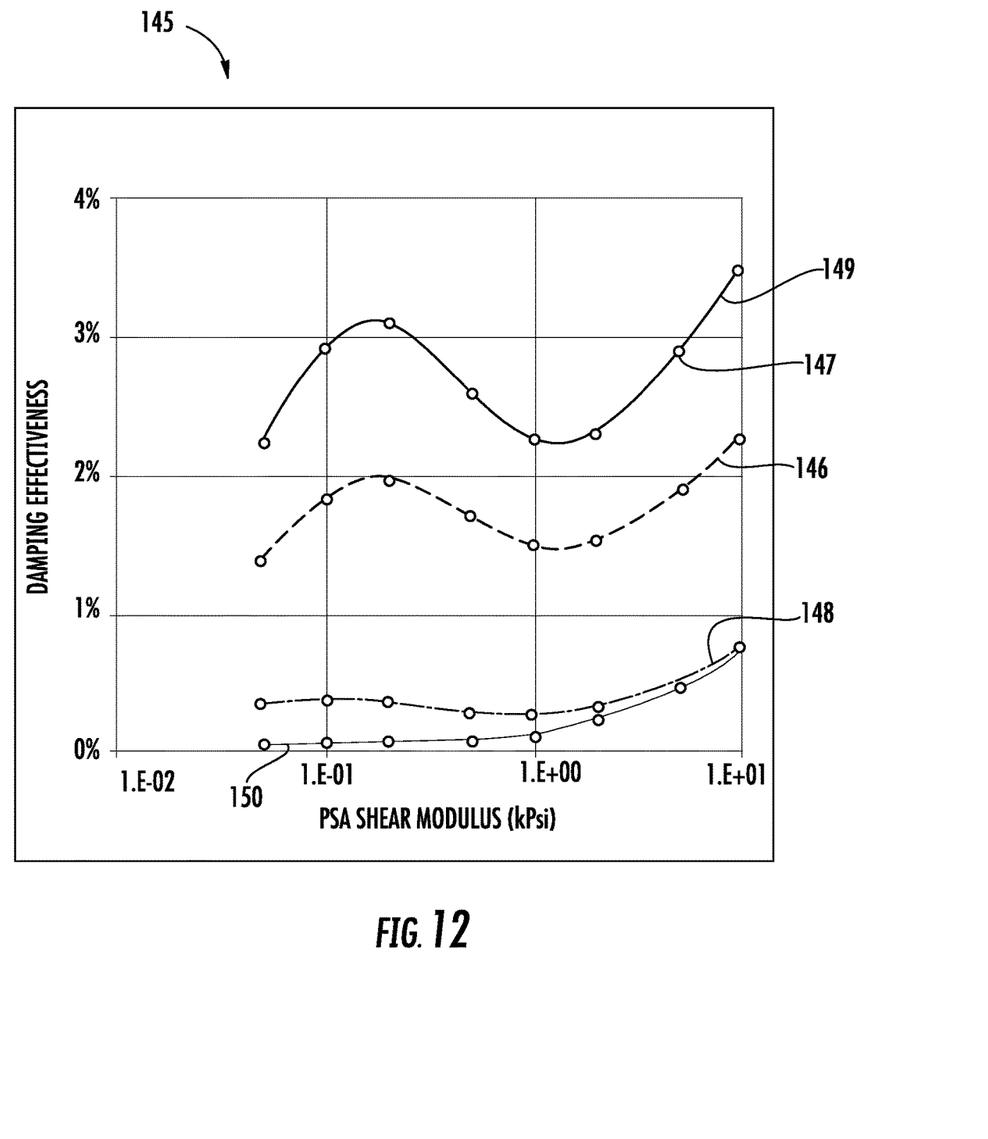
FIG. 12 is a graph of simulated damping effectiveness versus modulus of the pressure sensitive adhesive according to an embodiment.

Referring now to FIG. 11, in another embodiment, corresponding damper bodies 81a", 81b" may be carried by the outer arms 62a" of each of the inner and outer flexible members 63a", 63b". The corresponding graph 145 in FIG. 12, illustrates the damping effectiveness versus modulus of the pressure sensitive adhesive layer 82" is shown for a stainless steel damper body 81" of 150 microns carried by the outer arms 62a" of both the inner and outer flexible 63a", 63b" (FIG. 11) with a 25 micron pressure sensitive adhesive layer 82" across modes of operation. Line 146 corresponds to the working mode, line 147 corresponds to the Y-mode, line 148 corresponds to the Z-mode, line 149 corresponds to the yaw-mode, and line 150 corresponds to the rocking mode.

Figure 13:
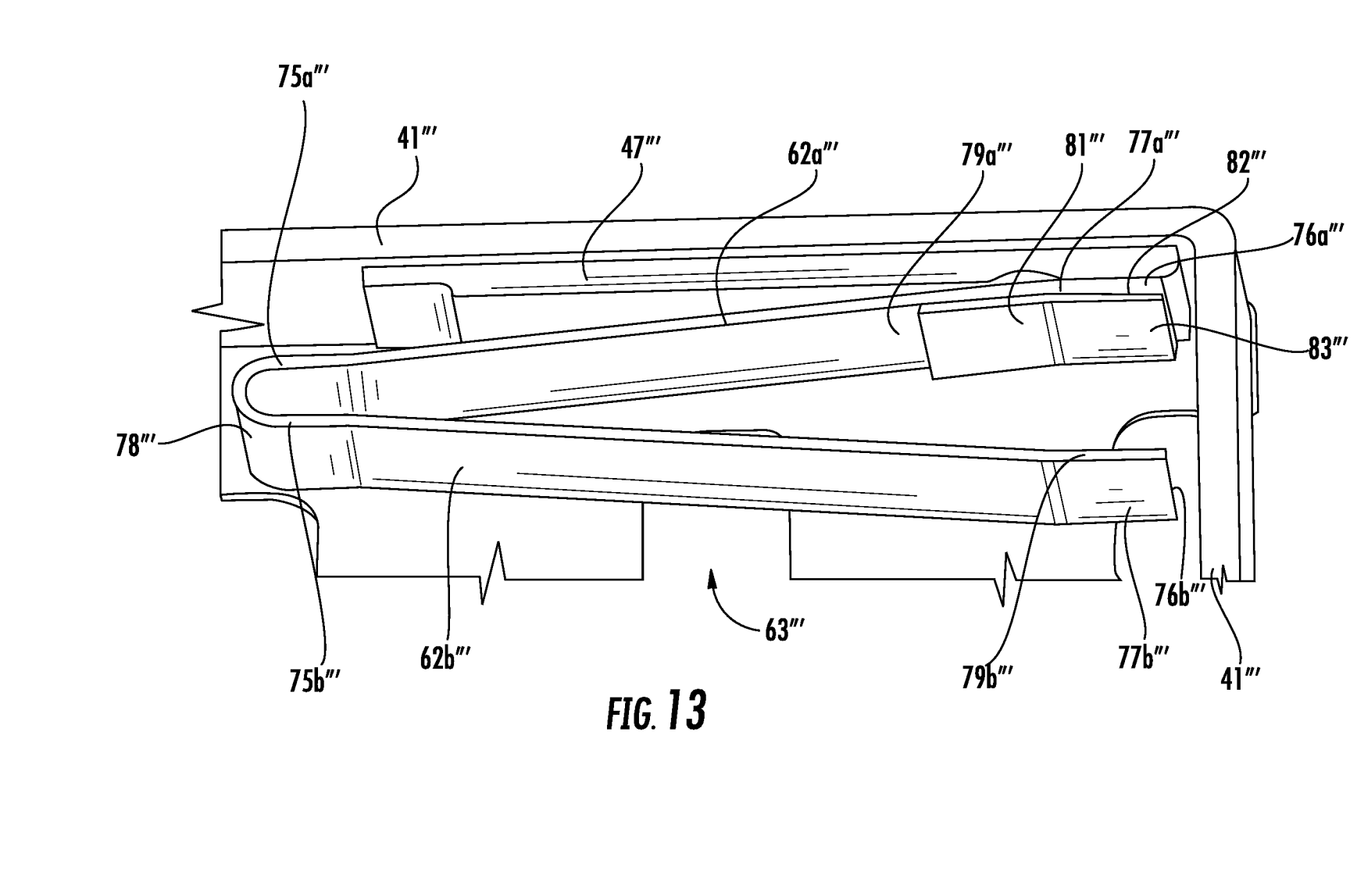
FIG. 13 is a schematic diagram of a portion of a haptic actuator according to another embodiment.
Figure 14:
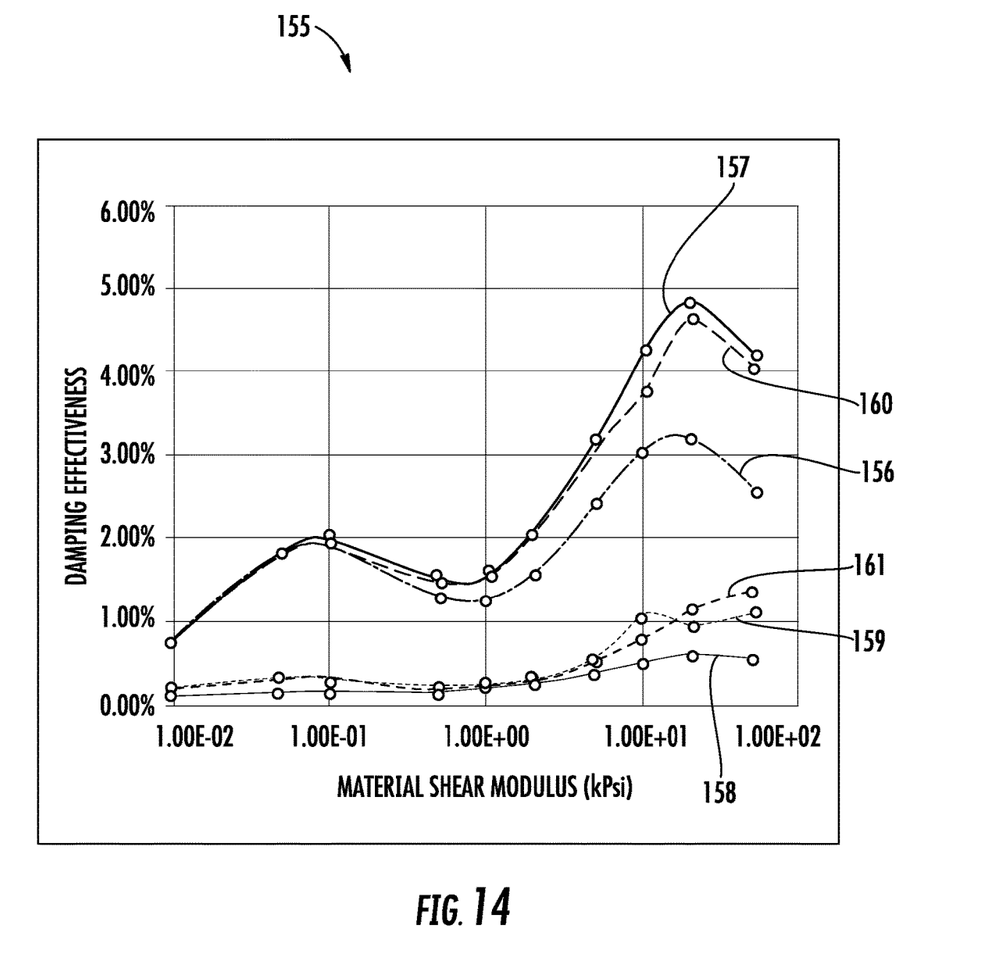
FIG. 14 is a graph of simulated effectiveness of a combined damper body, adhesive layer, and bumper body according to an embodiment.

Referring now to FIG. 13, in another embodiment, the damper body 81'" and adhesive layer 82'" form the bumper body 83'" (e.g. combined into a single monolithic unit). The graph 155 in FIG. 14 illustrates the effectiveness of a combined damper body 81'", adhesive layer 82'", and bumper body 83'". The damper body 81'" portion is a 100 microns thick stainless steel and the pressure sensitive adhesive layer 82'" portion is 25 microns thick. Line 156 corresponds to the working mode, line 157 corresponds to the Y-mode, line 158 corresponds to the first rocking mode, line 159 corresponds to the Z-mode, line 160 corresponds to the yaw-mode, and line 161 corresponds to the second out-of-plane rocking mode.

A method aspect is directed to a method of making a haptic actuator 40. The method includes mounting a field member 50 having opposing first and second sides 53, 54 within a housing 41 using a respective flexure bearing 60a, 60b so that each of first and second sides of the field member is reciprocally movable within the housing responsive to at least one coil 44, 45. The method also includes attaching a damper body 81 to at least one arm 62a, 62b of at least one flexure bearing 60a, 60b.

While an exemplary embodiment of a type and arrangement of flexure bearings has been described herein, it will be appreciated that other types of flexure bearings may be used, for example, which may have a different shape, size, flexure members, and/or anchor members. Moreover, while flexure bearings are described, in some embodiments, flexure bearings may be replaced with or used in conjunction with shafts, biasing members, and mechanical bearings. Still further, while the coils 44, 45 have been described as being stationary and the permanent magnets 51, 52 being movable, it will be appreciated that the coils may be carried by the field member 50 (i.e., movable) while the permanent magnets are fixed or carried by the actuator housing 41.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A haptic actuator comprising:
   a housing;
   at least one coil carried by the housing;
   a field member having opposing first and second sides; and
   a respective flexure bearing mounting each of the first and second sides of the field member to be reciprocally movable within the housing responsive to the at least one coil;
   at least one of the flexure bearings comprising an arm and a damper body attached thereto.

2. The haptic actuator of claim 1 further comprising an adhesive layer between the arm and the damper body.

3. The haptic actuator of claim 2 wherein the adhesive layer comprises a pressure sensitive adhesive layer.

4. The haptic actuator of claim 1 wherein the arm has a strip shape with opposing major surfaces; and wherein the damper body has a rectangular shape carried by one of the opposing major surfaces of the arm.

5. The haptic actuator of claim 1 wherein the at least one flexure bearing comprises a further arm joined together with the arm at proximal ends thereof and each having spaced apart distal ends operatively coupled between adjacent portions of the field member and the housing.

6. The haptic actuator of claim 5 wherein the damper body is carried by the spaced apart distal end of the arm.

7. The haptic actuator of claim 5 wherein the arm and further arm define a wishbone shape.

8. The haptic actuator of claim 5 wherein the at least one flexure bearing has a bend therein joining together the arm and the further arm at the proximal ends.

9. The haptic actuator of claim 1 wherein the damper body comprises stainless steel.

10. An electronic device comprising:
    a device housing;
    wireless communications circuitry carried by the device housing;
    a haptic actuator comprising
       an actuator housing,
       at least one coil carried by the actuator housing,
       a field member having opposing first and second sides, and
       a respective flexure bearing mounting each of the first and second sides of the field member to be reciprocally movable within the actuator housing responsive to the at least one coil,
       at least one of the flexure bearings comprising an arm and a damper body attached thereto; and
    a controller coupled to the wireless communications circuitry and the haptic actuator and configured to perform at least one wireless communications function and selectively operate the haptic actuator.

11. The electronic device of claim 10 wherein the haptic actuator further comprises an adhesive layer between the arm and the damper body.

12. The electronic device of claim 11 wherein the adhesive layer comprises a pressure sensitive adhesive layer.

13. The electronic device of claim 10 wherein the arm has a strip shape with opposing major surfaces; and wherein the damper body has a rectangular shape carried by one of the opposing major surfaces of the arm.

14. The electronic device of claim 10 wherein the at least one flexure bearing comprises a further arm joined together with the arm at proximal ends thereof and each having spaced apart distal ends operatively coupled between adjacent portions of the field member and the housing.

15. The electronic device of claim 14 wherein the damper body is carried by the spaced apart distal end of the arm.

16. The electronic device of claim 10 wherein the damper body comprises stainless steel.

17. A method of making a haptic actuator comprising:
    mounting a field member having opposing first and second sides within a housing using a respective flexure bearing so that each of first and second sides of the field member is reciprocally movable within the housing responsive to at least one coil; and
    attaching a damper body to at least one arm of at least one flexure bearing.

18. The method of claim 17 further comprising positioning an adhesive layer between the arm and the damper body.

19. The method of claim 18 wherein the adhesive layer comprises a pressure sensitive adhesive layer.

20. The method of claim 17 wherein the arm has a strip shape with opposing major surfaces; and wherein the damper body has a rectangular shape carried by one of the opposing major surfaces of the arm.

21. The method of claim 17 wherein the at least one flexure bearing comprises a further arm joined together with the arm at proximal ends thereof and each having spaced apart distal ends operatively coupled between adjacent portions of the field member and the housing.

22. The method of claim 17 wherein the damper body comprises stainless steel.

* * * * *